(12) United States Patent
Nguyen et al.

(10) Patent No.: US 8,360,003 B2
(45) Date of Patent: Jan. 29, 2013

(54) PLASMA REACTOR WITH UNIFORM PROCESS RATE DISTRIBUTION BY IMPROVED RF GROUND RETURN PATH

(75) Inventors: Andrew Nguyen, San Jose, CA (US); Hiroji Hanawa, Sunnyvale, CA (US); Kartik Ramaswamy, San Jose, CA (US); Samer Banna, San Jose, CA (US); Anchel Sheyner, San Francisco, CA (US); Valentin N. Todorow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 711 days.

(21) Appl. No.: 12/501,966

(22) Filed: Jul. 13, 2009

(65) Prior Publication Data

US 2011/0005685 A1  Jan. 13, 2011

(51) Int. Cl.
*C23C 16/00* (2006.01)
*H01L 21/306* (2006.01)

(52) U.S. Cl. .............. 118/723 R; 118/723 I; 118/723 E; 118/723 MW; 156/345.41; 156/345.47; 156/345.48

(58) Field of Classification Search ................ 118/723 I, 118/723 IR, 723 AN, 723 R, 723 E, 723 MW; 156/345.48, 345.49, 345.41, 345.47; 315/111.51
See application file for complete search history.

(56) References Cited

U.S. PATENT DOCUMENTS

| | | | |
|---|---|---|---|
| 6,129,808 A * | 10/2000 | Wicker et al. | 156/345.1 |
| 2007/0238199 A1* | 10/2007 | Yamashita | 438/5 |
| 2008/0102202 A1 | 5/2008 | Chandrachood et al. | 427/248.1 |
| 2008/0193673 A1 | 8/2008 | Paterson et al. | 427/569 |
| 2008/0274297 A1 | 11/2008 | Furuta et al. | 427/569 |

FOREIGN PATENT DOCUMENTS

JP  2000-323460  11/2000

* cited by examiner

*Primary Examiner* — Luz L. Alejandro
(74) *Attorney, Agent, or Firm* — Robert M. Wallace

(57) ABSTRACT

In a plasma reactor having an RF plasma source power applicator at its ceiling, an integrally formed grid liner includes a radially extending plasma confinement ring and an axially extending side wall liner. The plasma confinement ring extends radially outwardly near the plane of a workpiece support surface from a pedestal side wall, and includes an annular array of radial slots, each of the slots having a narrow width corresponding to an ion collision mean free path length of a plasma in the chamber. The side wall liner covers an interior surface of the chamber side wall and extends axially from a height near a height of said workpiece support surface to the chamber ceiling.

4 Claims, 6 Drawing Sheets

— PLASMA REACTOR WITH UNIFORM
PROCESS RATE DISTRIBUTION BY
IMPROVED RF GROUND RETURN PATH

BACKGROUND

Plasma processing of semiconductor wafers or other types of workpieces, such as plasma displays, solar panels or photolithographic masks, is employed to perform etch processes, deposition processes and plasma immersion ion implantation processes, for example. The plasma source may be an RF source having a capacitively coupled source power applicator such as a ceiling electrode or an inductively coupled source power applicator such as a coil antenna. The rate at which the plasma process is carried out is typically different at different locations on the workpiece surface. For example, a plasma etch process may have a non-uniform etch rate distribution across the workpiece surface. It is critical that the process rate distribution across a workpiece surface be as uniform as possible. This is particularly true in the fabrication of integrated circuits on a semiconductor wafer, in which critical dimensions of thin film structures have been reduced to 32 nanometers or less. At such small feature sizes, a non-uniform etch rate distribution can cause etch stop in some portions of the wafer and over-etching in other portions of the wafer.

Such process rate distribution non-uniformities may have a radial pattern, in which the spatial distribution of etch rate across the workpiece surface is center-high or center-low, for example. Such radial non-uniformity can be ameliorated or eliminated by employing independently controlled RF source power applicators at different radial locations relative to the plasma reactor chamber. For example, in the case of an inductively coupled RF source power applicator overlying the plasma chamber ceiling, the RF power applicator may consist of inner and outer coil antennas overlying radially inner and outer zones of the workpiece. Radial non-uniformity in distribution of plasma process rate is removed or minimized by adjusting the relative amounts of RF power applied to the inner and outer coil antennas.

The process rate distribution may also have an azimuthal pattern of non-uniformity, which may be referred to as "skew", in which the process rate varies with the rotational angle about the central axis of symmetry of the workpiece and reactor chamber. Because the skew pattern is inherently asymmetrical, it is challenging to provide an RF source power applicator that may be adjusted to remove or minimize a particular skew pattern exhibited by a plasma reactor.

SUMMARY

A plasma reactor includes a reactor chamber enclosed by a chamber side wall, a floor and an overhead ceiling. A workpiece support pedestal is in the chamber and has a pedestal side wall coaxial with the chamber side wall, and a workpiece support surface at a top end of the pedestal and facing the overhead ceiling. The chamber and pedestal side walls define therebetween a pumping annulus extending from the top end of the pedestal side wall to the floor. A plasma source power applicator is adjacent the ceiling and a source of RF power is coupled between RF ground and the plasma source power applicator. The plasma reactor further includes an integrally formed ground return path liner. The integrally formed ground return path liner includes a plasma confinement ring extending radially outwardly from the pedestal side wall and being adjacent or at least nearly co-planar with the workpiece support surface, the plasma confinement ring comprising an annular array of radial slots, each of the slots having a narrow width corresponding to an ion collision mean free path length of a plasma. The integrally formed ground return path liner further includes a side wall liner covering an interior surface of the side wall and extending axially from a height near a height of the workpiece support surface to the ceiling. The integrally formed ground return path liner also includes an intermediate section having a curved cross-sectional shape and integrally joining together a radially outward end of the plasma confinement ring and a bottom end of the removable side wall liner. The integrally formed ground return path liner eliminates or minimizes skew or asymmetries in plasma process distribution across the workpiece surface by providing a uniform RF ground return of minimum length for RF power from the RF source power applicator.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
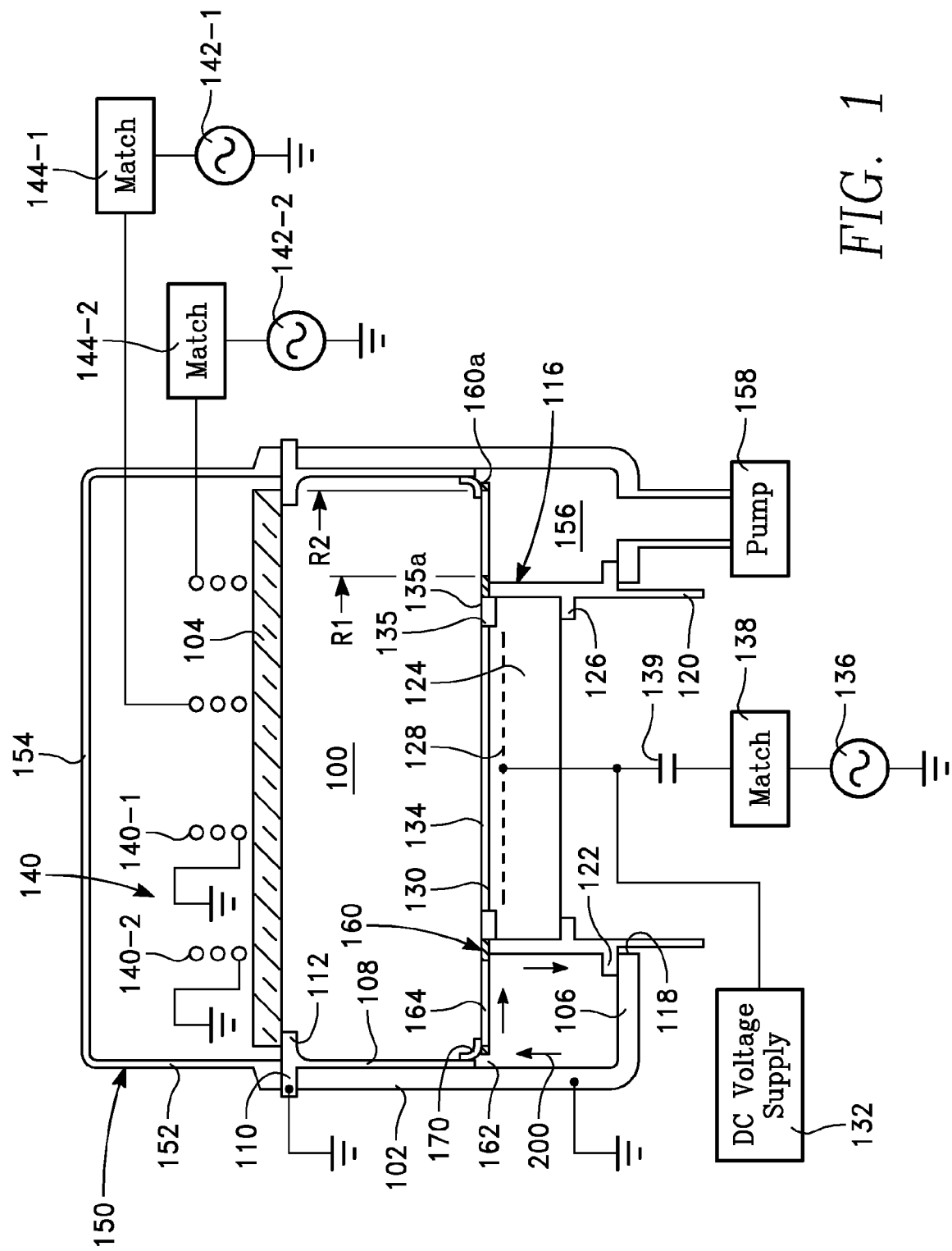
FIG. 1 is a cut-away side view of a plasma reactor chamber in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

We have discovered that one of the causes of asymmetrical or skew non-uniformities in plasma process distribution across a workpiece lies in the effects of an RF ground return path that is followed by RF source power applied at the chamber ceiling, the RF ground return path extending through the wafer or workpiece and reaching RF ground through the chamber side wall. We have discovered that the undesirable effects of the RF ground return path arise from the fact that it is relatively long, circuitous and extends through several chamber components. Such chamber components themselves may have asymmetrical properties. We have further discovered that this skew problem is solved by introducing a structure that provides the most direct path to RF ground for RF ground currents returning through the workpiece. Embodiments of the present invention provide a reduction or virtual elimination of asymmetries or skew nonuniformities in process rate distribution across the workpiece surface, as will be described below.

Referring to FIG. 1, a plasma reactor chamber 100 is defined by a cylindrical side wall 102, a ceiling 104 and a floor 106. A cylindrical liner 108 has an outer shoulder 110 resting on a top surface of the side wall 102 and an inner shoulder 112 supporting the ceiling 104. The cylindrical liner is a consumable component of the chamber and is readily removed and replaced periodically. It is generally formed of a metal. A workpiece support pedestal 116 extends through an opening 118 in the floor 106 and includes a cylindrical pedestal wall 120 having an outer shoulder 122 supported by the floor 106. The pedestal 116 further includes an electrostatic chuck (ESC) 124 supported on an inner shoulder 126 of the pedestal wall 120. The ESC 124 includes an internal electrode 128 and a workpiece support surface 130 overlying and insulated from the electrode 128. A D.C. voltage source 132 provides an electrostatic clamping voltage to the ESC electrode 128 for holding a semiconductor workpiece or wafer 134 to the support surface 130. An annular process ring 135 surrounds the wafer or workpiece 134 and has a top surface 135a generally co-planar with the top surface of the workpiece 134. The process ring 135 may be formed of the same material as the workpiece 134. Optionally, RF bias power from an RF bias power generator 136 may be applied to the electrode 128 through an impedance match 138 and an isolation capacitor 139. An inductively coupled RF source power applicator 140 overlies the ceiling 104. Optionally, the RF source power applicator may consist of radially inner and outer applicator portions 140-1, 140-2 that are independently driven by respective RF source power generators 142-1, 142-2 through respective RF impedance matches 144-1, 144-2. Each RF source power applicator portion 140-1, 140-2 is a solenoidal coil antenna. The ceiling 104 is formed of a dielectric or semiconductor material that enables the inductive RF field from the RF source power applicator 140 to pass through the ceiling 104. A metallic shield 150 surrounds the coil antennas 140-1, 140-2 and consists of a metallic cylindrical wall 152 and a discoid ceiling 154. The shield 150 rests on top of the cylindrical liner 108, the connection between the shield 150 and the cylindrical liner 108 providing a ground return path extending axially up the length of the cylindrical shield and terminating at the ceiling adjacent the touching surfaces of the shield 150 and liner 108. The pedestal wall 120 and the chamber side wall 102 define an annular volume or pumping annulus 156 through which a vacuum pump 158 evacuates the chamber 100.

Some plasma may be lost from the processing region overlying the workpiece 134 into the pumping annulus, thereby affecting process rate and attacking chamber surfaces in the pumping annulus 156.

Optionally, a plasma confinement grid 160 extends radially from the wafer support pedestal 116 into the pumping annulus 156. The grid 160 is supported on a top edge of the cylindrical pedestal wall 120, as shown in FIG. 1. The top surface of the plasma confinement grid 160 is co-planar or nearly co-planar with the workpiece 134 or with the workpiece support surface 130 or slightly below it. The grid 160 reduces or blocks plasma flow into the pumping annulus 156 without significantly blocking gas flow to the pumping annulus 156, in order to permit the vacuum pump 158 to evacuate the chamber 100. A gap 162 is provided between the outer edge of the confinement grid 160 and the cylindrical liner 108. In one embodiment, the gap 162 ensures adequate gas flow past the confinement grid 160. The grid 160 has radial slots 164 extending between two radii R1, R2, corresponding to a radial length R2-R1, and arrayed in an annular pattern, best shown in FIG. 2. The radial slots 164 further enhance gas flow into the pumping annulus 156. In order to confine plasma above the grid 160, each slot 164 has an azimuthal width W that is less than the ion collision mean free path length of the plasma generated in the process region between the workpiece 134 and the ceiling 104. In one embodiment, W is about 0.2 inch.

Figure 2:
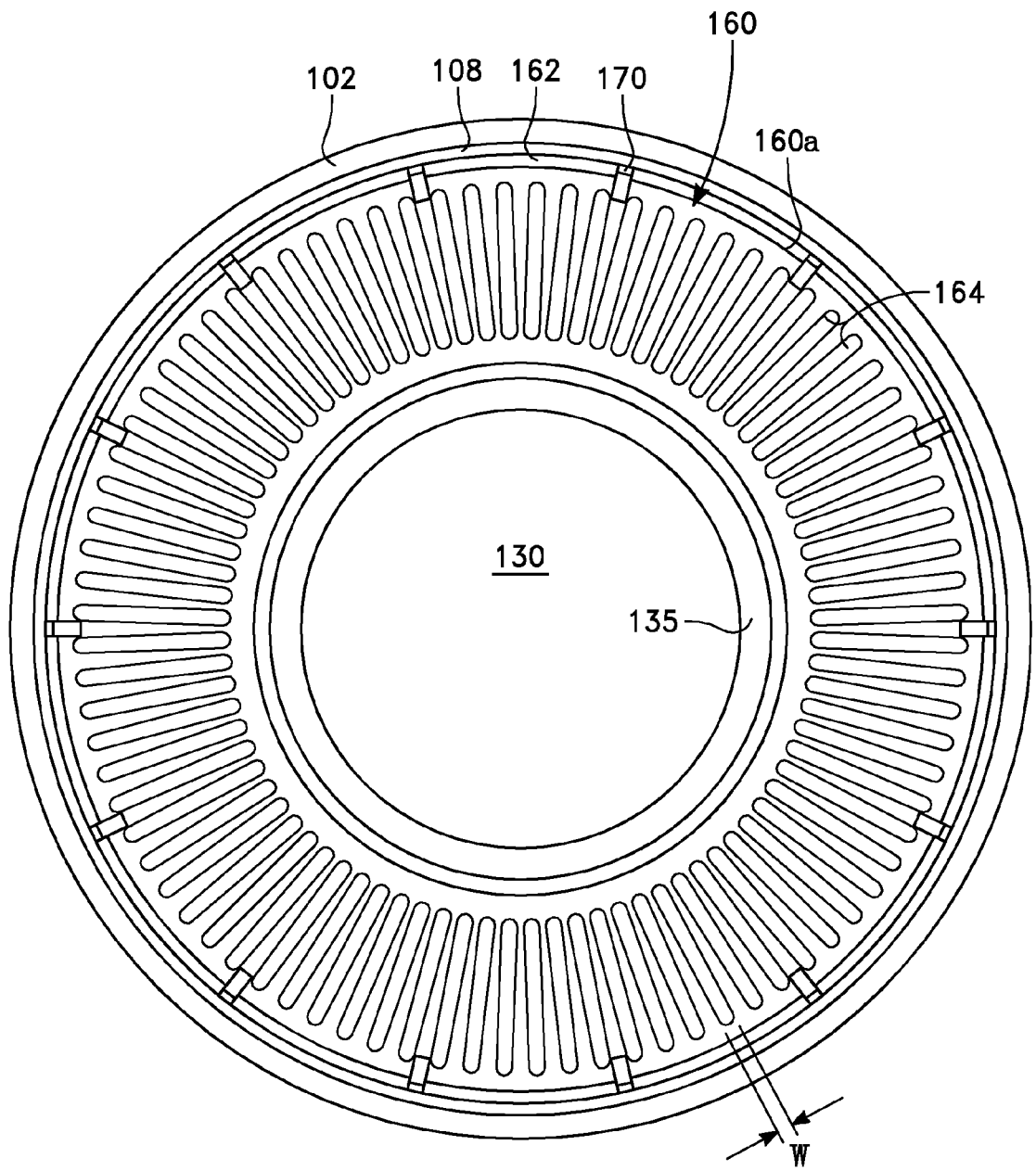
FIG. 2 is a plan view of a portion of the embodiment of FIG. 1.

We have discovered that skew in plasma process rate distribution across the workpiece surface is either dramatically reduced or eliminated by providing an RF current path directly from an outer edge 160a of the grid 160 to the cylindrical liner 108. For this purpose, metallic brackets 170 are fastened between the grid 160 and the liner 108. Each bracket 170 is fastened, for example by screws, to an outer periphery of the grid 160 and to the nearest surface. As shown in FIG. 2, the brackets 170 are arrayed at uniform intervals around the grid 160. The introduction of the discrete brackets 170 does not noticeably interfere with gas flow into the pumping annulus 156.

Figure 3:
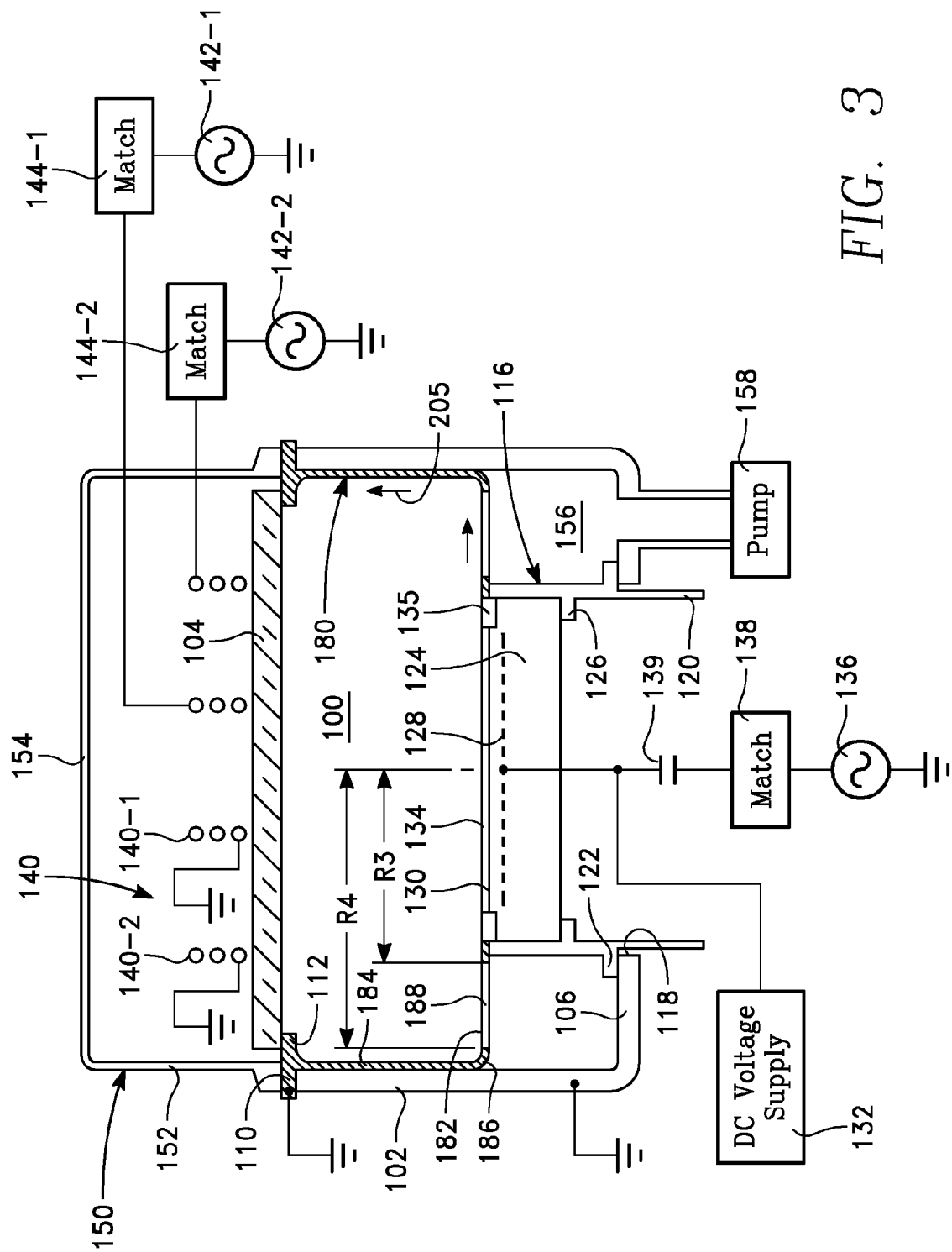
FIG. 3 is a cut-away side view of a plasma reactor chamber in accordance with a second embodiment.
Figure 4:
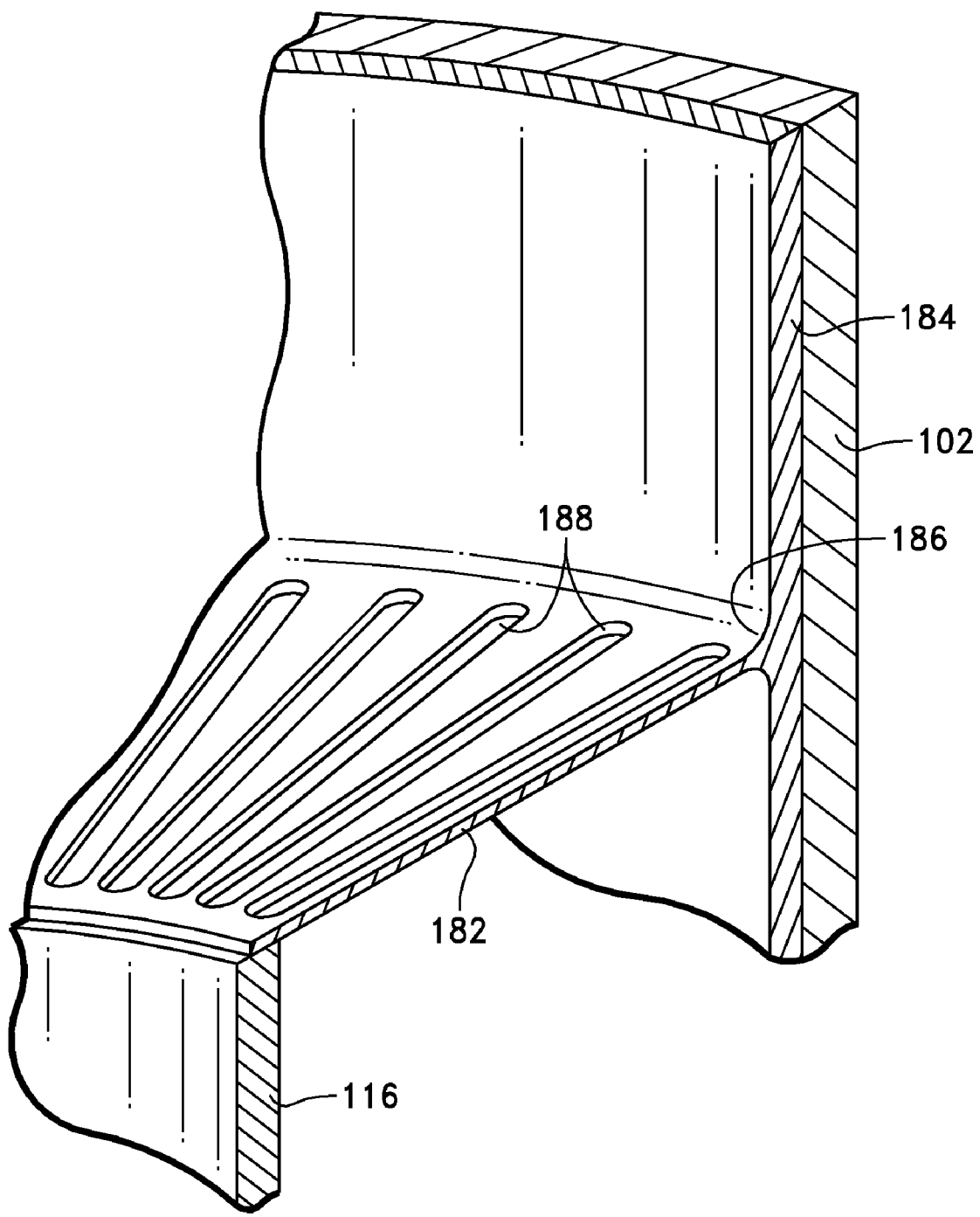
FIG. 4 is a perspective view of a portion of the embodiment of FIG. 3.

FIGS. 3 and 4 depict an embodiment in which the direct RF current path provided by the brackets 170 is instead provided by forming the plasma confinement grid 160 of FIG. 1 and the cylindrical liner 108 of FIG. 1 as a monolithic integrally formed grid-liner 180. The grid-liner 180 of FIGS. 3 and 4 has a radial section 182 corresponding to the plasma confinement grid 160 of FIGS. 1 and 2, an axial section 184 corresponding to the cylindrical liner 108, and an intermediate section 186 joining the radial and axial sections 182, 184. The intermediate section 186 is formed of metal and therefore provides a conductive path between the radial and axial sections 182, 184, and has an arcuate cross-sectional shape to provide a smooth surface transition and minimize undesirable interaction with plasma. The radial section 182 includes an annular array of radial slots 188 corresponding to the radial slots 164 of FIGS. 1 and 2, and may have dimensions corresponding thereto. The presence of the curved intermediate section 186 eliminates the gap 162 of FIGS. 1 and 2, forcing all of the gas drawn by the vacuum pump 158 to flow through the radial slots 188. In order to compensate for elimination of the gap and in order to avoid an increase in gas flow resistance, the area of each radial slot 188 may be increased without increasing its width W beyond the ion collision mean free path length, by increasing its radial length. For this purpose, each slot 188 in the embodiment of FIGS. 3 and 4 lies between two radii R3, R4 defining a radial length R4-R3 greater than that of the embodiment of FIGS. 1 and 2 (i.e., R2-R1). This increase may correspond to a 5% to 20% increase in radial length, for example.

Figure 5A:
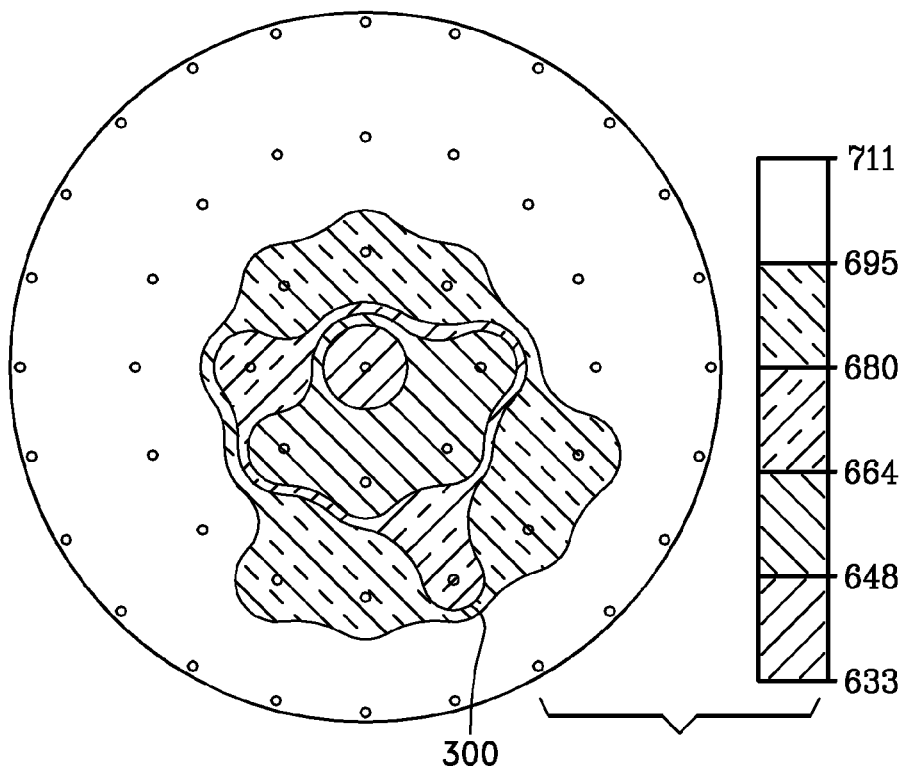
FIG. 5A is a graph of two-dimensional spatial distribution of etch rate obtained with a conventional RF ground return path.
Figure 5B:
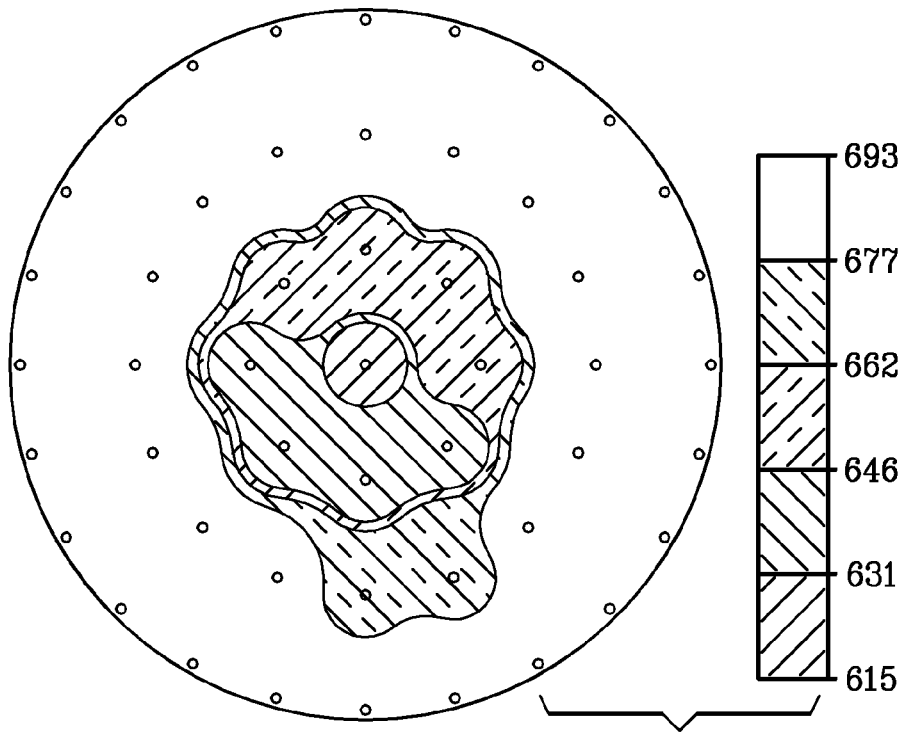
FIG. 5B is a graph of two-dimensional spatial distribution of etch rate obtained with a uniform RF ground return path in accordance with one embodiment.

FIG. 5A depicts the two-dimensional distribution of etch rate on a semiconductor wafer subjected to a plasma etch process in the reactor chamber of FIG. 1 in absence of the array of brackets 170. FIG. 5A depicts a very large skew 300 in the etch rate distribution. FIG. 5B depicts the two-dimensional distribution of etch rate on a semiconductor wafer subjected to the same plasma etch process in the reactor chamber of FIG. 1 with the brackets 170 installed. FIG. 5B shows that there is relatively little skew in the etch rate distribution when the brackets 170 are installed.

Our discovery involves the effects of the RF ground return current paths. Arrows 200 of FIG. 1 indicate the circuitous RF ground return path that exists in absence of the brackets 170. RF power delivered by the RF source power applicator 140 develops a ground return current that flows radially outwardly on the top surface of the wafer 134 and of the grid 160, then wraps underneath to flow radially inwardly along the bottom surface of the grid 160, then axially downward along the outside surface of the pedestal wall 120, radially outwardly along the floor 106 and the vertically up along the interior surface of the side wall 102 and the up along the interior surface of the liner 108. Arrows 205 of FIG. 3 indicate the direct path that is provided for the RF ground return currents, the direct path of FIG. 3 flowing radially outwardly along the top surface of the wafer 134 and then along the interior surface of the liner-grid 180. This short and more direct path is apparently distributed more uniformly and therefore does not introduce the asymmetries manifest in the data of FIG. 5A.

Figure 6A:
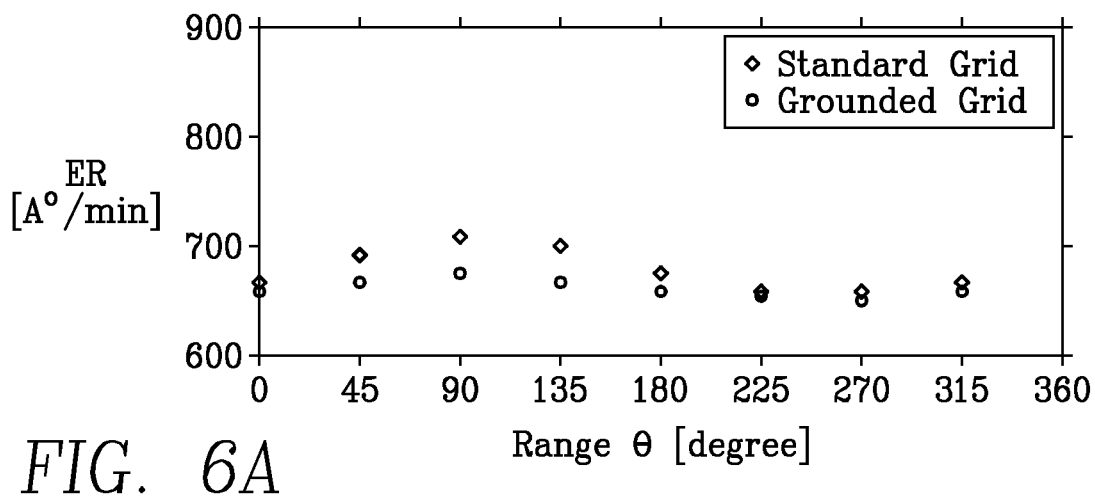
FIGS. 6A, 6B and 6C are comparative graphs of etch rates as a function of azimuthal angle at respective radial locations using a conventional RF ground return path and using a uniform RF ground return path in accordance with one embodiment.
Figure 6B:
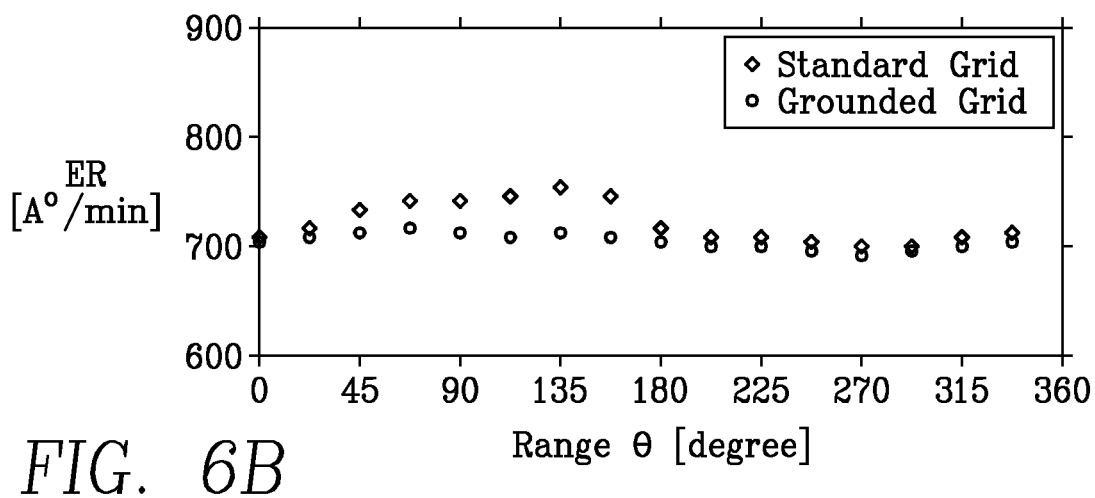
Figure 6C:
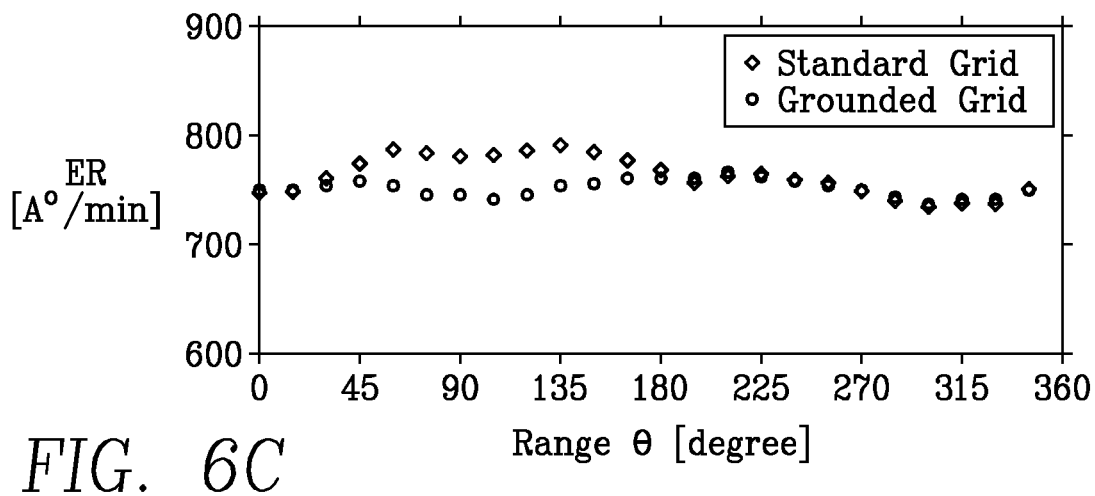

FIGS. 6A, 6B and 6C compare measured data obtained with and without the brackets 170 of FIG. 1. Each point in FIG. 6A is a measured etch rate at an inner radius at a particular azimuthal angle. The diamond-shaped points correspond to an absence of the brackets 170 and the circular-shaped points correspond to data obtained with the brackets 170 in place as shown in FIG. 1. FIG. 6B depicts the same type of data as FIG. 6A except that the measurements were taken at an intermediate radius. FIG. 6C depicts the same type of data as FIG. 6A except that the measurements were taken at an outer radius. Analysis of the data of FIGS. 6A-6C indicates the following: In the inner radius (FIG. 6A), without the brackets 170 the variation in etch rate was 48.2 Å/min with a variance of 7.06%, while introduction of the brackets 170 reduced the variation to 28.4 Å/min and the variance to 4.29%. In the intermediate radius (FIG. 6B), without the brackets 170 the variation in etch rate was 55.7 Å/min with a variance of 7.71%, while introduction of the brackets 170 reduced the variation to 26.4 Å/min and the variance to 3.75%. In the outer radius (FIG. 6C), without the brackets 170 the variation in etch rate was 59.1 Å/min with a variance of 7.75%, while introduction of the brackets 170 reduced the variation to 36.4 Å/min and the variance to 4.84%. These results indicate that the improvement gained by changing the ground return path from the circuitous one of FIG. 1 to the direct one of FIG. 3 is a factor of 1.5 or more in reduction of asymmetry or skew.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a reactor chamber enclosed by a chamber side wall, a floor and an overhead ceiling;
   a workpiece support pedestal in said chamber and comprising a pedestal side wall coaxial with said chamber side wall, and a workpiece support surface at a top end of said pedestal and facing said overhead ceiling, said chamber and pedestal side walls defining therebetween a pumping annulus extending from the top end of said pedestal side wall to said floor;
   a plasma source power applicator adjacent said ceiling and a source of RF power coupled between RF ground and said plasma source power applicator;
   a plasma confinement ring extending radially outwardly from said pedestal side wall and being co-planar or below said workpiece support surface, said plasma confinement ring comprising an annular array of radial slots, each of said slots having a narrow width corresponding to an ion collision mean free path length of a plasma;
   a removable side wall liner covering an interior surface of said side wall and extending axially from a height near a height of said workpiece support surface to said ceiling;
   a direct conductive path element between a radially outer edge of said plasma confinement ring and a bottom end of said removable side wall liner;
   wherein said direct conductive path element comprises a plurality of metal brackets each fastened to a bottom end of said removable liner and to a radially outward end of said plasma confinement ring, said brackets being distributed along a circumference of said plasma confinement ring; and
   a circumferential gas flow gap between said bottom end of said removable liner and said radially outward end of said plasma confinement ring, said metal brackets spanning said circumferential gas flow gap.

2. The plasma reactor of claim 1 wherein said direct conductive path element comprises a continuous metal annulus integrally formed with a bottom end of said removable side wall liner and a radially outward end of said plasma confinement ring.

3. The plasma reactor of claim 2 wherein said continuous metal annulus extends along an entire circumference of said radially outward end of said plasma confinement ring.

4. The plasma reactor of claim 3 wherein said removable liner is coupled to RF ground.

* * * * *